United States Patent [19]

Kudose

[11] Patent Number: 5,390,030
[45] Date of Patent: Feb. 14, 1995

[54] PEAK HOLDING CIRCUIT AND VIDEO PROCESSING UNIT USING THE SAME

[75] Inventor: Hiroyuki Kudose, Isehara, Japan

[73] Assignee: Ricoh Company, Ltd., Tokyo, Japan

[21] Appl. No.: 71,609

[22] Filed: Jun. 4, 1993

Related U.S. Application Data

[63] Continuation of Ser. No. 637,637, Jan. 4, 1991, abandoned.

[30] Foreign Application Priority Data

Jan. 8, 1990 [JP] Japan ................... 2-2038

[51] Int. Cl.⁶ ........................... H04N 1/40
[52] U.S. Cl. ................... 358/461; 358/456; 358/466; 382/52
[58] Field of Search ........... 387/351, 353; 358/456, 358/461, 464, 463, 466; 382/52, 53; 307/351, 353; 348/573; 324/103 P

[56] References Cited

U.S. PATENT DOCUMENTS

| | | |
|---|---|---|
| 3,973,197 | 8/1976 | Meyer . |
| 4,097,847 | 6/1978 | Forsen et al. ............... 382/22 |
| 4,319,270 | 3/1982 | Kimura et al. ............. 358/100 |
| 4,373,139 | 2/1983 | Beesley ....................... 307/351 |
| 4,839,739 | 6/1989 | Tachiuchi et al. .......... 358/466 |
| 4,841,374 | 6/1989 | Kotani et al. ............... 358/447 |
| 4,864,167 | 9/1989 | McKibben et al. ......... 307/351 |
| 4,868,470 | 9/1989 | Bucska et al. .............. 307/351 |
| 4,868,685 | 9/1989 | Ueno ............................ 358/461 |
| 4,870,501 | 9/1989 | Yoshida ....................... 358/461 |
| 5,065,257 | 11/1991 | Yamada ....................... 358/463 |
| 5,105,286 | 4/1992 | Sakurai ........................ 358/461 |
| 5,115,325 | 5/1992 | Kallin et al. ................ 358/461 |

FOREIGN PATENT DOCUMENTS

| | | |
|---|---|---|
| 0224935 | 6/1987 | European Pat. Off. . |
| 0251528 | 1/1988 | European Pat. Off. . |
| 3716921 | 12/1988 | Germany . |
| 3822195 | 1/1990 | Germany . |

OTHER PUBLICATIONS

Elektronik, 17/27 Aug. 1982, pp. 47–53, C. Tinnemeier, et al., "Storsicherer Spitzenwertdetektor".

Primary Examiner—Edward L. Coles, Sr.
Assistant Examiner—Thomas L. Stoll
Attorney, Agent, or Firm—Oblon, Spivak, McClelland, Maier & Neustadt

[57] ABSTRACT

A peak holding circuit includes a peak holding register for holding a current peak value, and an operation circuit for comparing the current peak value with an input signal and for performing a predetermined operation on the current peak value and the input signal when the input signal has a level greater than the current peak value, so that the current peak value is renewed and written into the peak holding register. A video processing unit which uses the above-mentioned peak holding circuit is also provided.

8 Claims, 5 Drawing Sheets

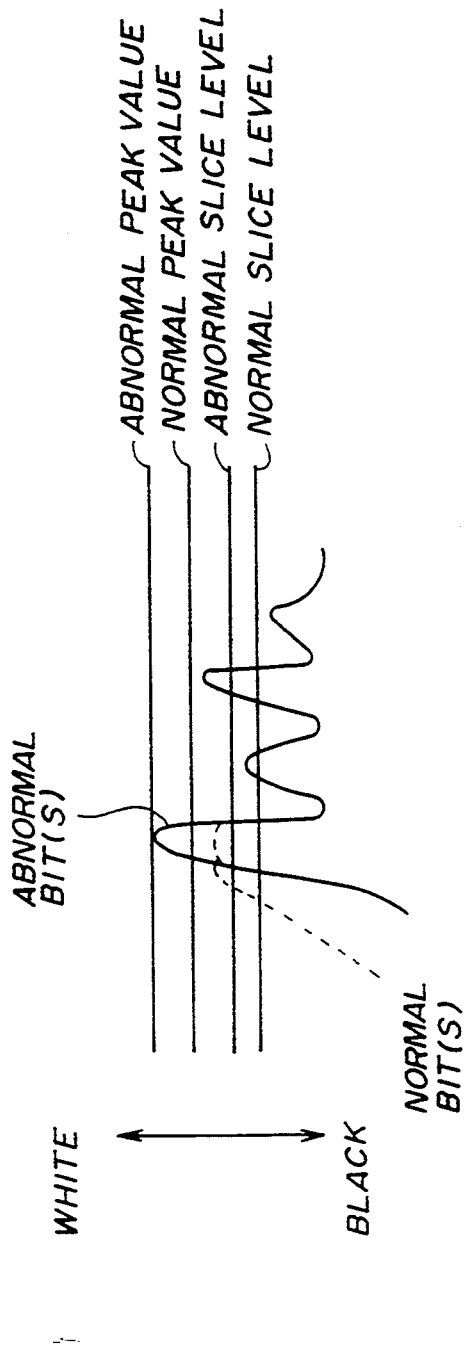
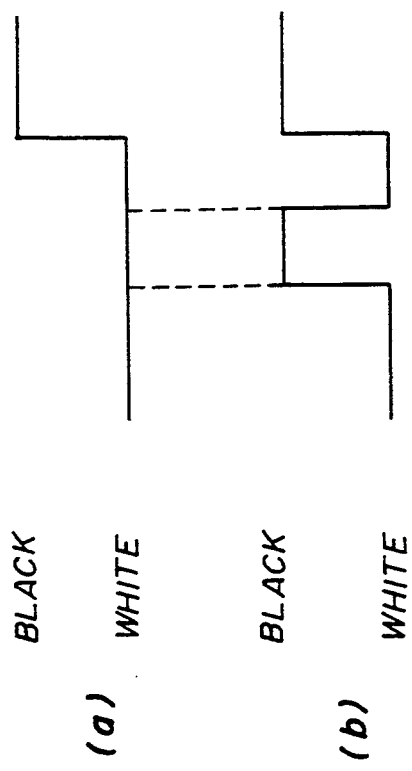

PEAK HOLDING CIRCUIT AND VIDEO PROCESSING UNIT USING THE SAME

This application is a continuation of application Ser. No. 07/637,637, filed on Jan. 4, 1991, now abandoned.

BACKGROUND OF THE INVENTION

The present invention generally relates to peak holding circuits, and more particularly to a peak holding circuit used for video processing in a scanner apparatus or the like.

Referring to FIG. 1, there is illustrated a a conventional peak holding circuit 1 provided in a video processing part of a scanner apparatus. The peak holding circuit 1 is composed of a peak holding register 2 and a comparator circuit 3. An original scanner 4 optically reads an original and outputs an analog video signal. An analog-to-digital (A/D) converter 5 receives the analog video signal, and converts it into a digital video signal based on the peak values of the analog video signal. The digital video signal is supplied to the peak holding register 2 and the comparator circuit 3. The peak holding register 2 holds the peak values of the digital video signal which is input in synchronism with a clock signal CLK. The peak values held by the peak holding register 2 is input to the comparator circuit 3. The comparator circuit 3 compares the digital video signal from the A/D converter 5 with the peak value from the peak holding register 2, and selects one of the outputs from the peak holding register 2 and the A/D converter which is greater than the other one. The selected value from the comparator circuit 3 is output to an external binarization circuit (not shown). That is, the peak holding circuit 1 always holds data having the greater peak values.

FIG. 2 is a flowchart showing a binarization procedure which utilizes the above-mentioned peak holding circuit 1. In FIG. 2, BD, PD, PD' and BVIDEO are defined as follows:

BD: input video data (digital video signal);
PD: current peak value;
PD': new peak value; and
BVIDEO: binarized video data.

Steps P1 and P2 are related to the operation of the peak holding circuit 1. At step P1, the comparator circuit 3 compares the input video data BD with the current peak value PD. When BD>PD, at step P2, the input video data BD is latched in the peak holding register 2 in synchronism with the clock signal CLK, so that the input video data BD is written into the peak holding register 2 as the new peak value PD'. Steps P3, P4 and P5 are related to the operation of the binarization circuit (not shown in FIG. 1). When the input video data is equal to or greater than 60% of the new (current) peak value PD' (=PD) in the peak holding register 2, the input video data BD is set to be "0" (white) of the binarized video data BVIDEO at steps P3 and P4. On the other hand, when the input video data is smaller than 60% of the new peak value PD' (=PD), the input video data BD is set to be "1" (black) of the binarized video data BVIDEO at steps P3 and P5.

However, conventional peak holding circuits as described above have a disadvantage in that they are easily affected by noise like dust on the original. The existence of noise causes a peak value greater than the original (true) peak value. In other words, the input video data has an abnormal bit or bits resulting from noise. In this case, the binarized video data becomes incorrect, and thus an image reproduced from the above binarized video data becomes different from the original image.

The above-mentioned disadvantage will further be described with reference to FIG. 3. The input video data has an abnormal peak value based on an abnormal bit or bits which is higher than a normal (true) peak value based on a normal bit or bits. When such an abnormal peak value is held by the peak holding circuit 1, a slice (threshold) level (PD'×0.6) used in the binarization operation is abnormally set to be a higher level. As a result, the peak value which should be recognized to be "white" as shown in FIG. 4(a) is mistakenly recognized to be "black" as shown in FIG. 4(b).

SUMMARY OF THE INVENTION

It is a general object of the present invention to provide an improved peak holding circuit in which the above-mentioned disadvantage is eliminated.

A more specific object of the present invention is to provide a peak holding circuit in which the influence of the occurrence of an abnormal bit(s) is suppressed.

The above-mentioned objects of the present invention are achieved by a peak holding circuit comprising: peak holding register means for holding a current peak value; and operation means for comparing the current peak value with an input signal and for performing a predetermined operation on the current peak value and the input signal when the input signal has a level greater than the current peak value, so that the current peak value is renewed and written into the peak holding register means.

Another object of the present invention is to provide a video processing unit having the above-mentioned peak holding means.

This object of the present invention is achieved by a video processing unit comprising: scanner means for optically scanning an original and for generating an analog video signal; converter means for converting the analog video signal into a digital video signal; a peak holding circuit comprising peak holding register means for holding a current peak value, and operation means for comparing the current peak value with the digital video signal and for performing a predetermined operation on the current peak value and the digital video signal when the digital video signal has a value greater than the current peak value, so that the current peak value is renewed and written into the peak holding register means; and binarization means for generating a binarized digital video signal from the current peak value in the peak holding register means and the digital video signal from the converter means.

BRIEF DESCRIPTION OF THE DRAWINGS

Other objects, features and advantages of the present invention will become more apparent from the following detailed description when read in conjunction with the accompanying drawings, in which:

FIG. 3 is a waveform diagram illustrating a disadvantage of the conventional peak holding circuit shown in FIG. 1;

FIG. 4 is a waveform diagram illustrating the disadvantage of the conventional peak holding circuit shown in FIG. 1;

DESCRIPTION OF THE PREFERRED EMBODIMENTS

Figures 1, 5:
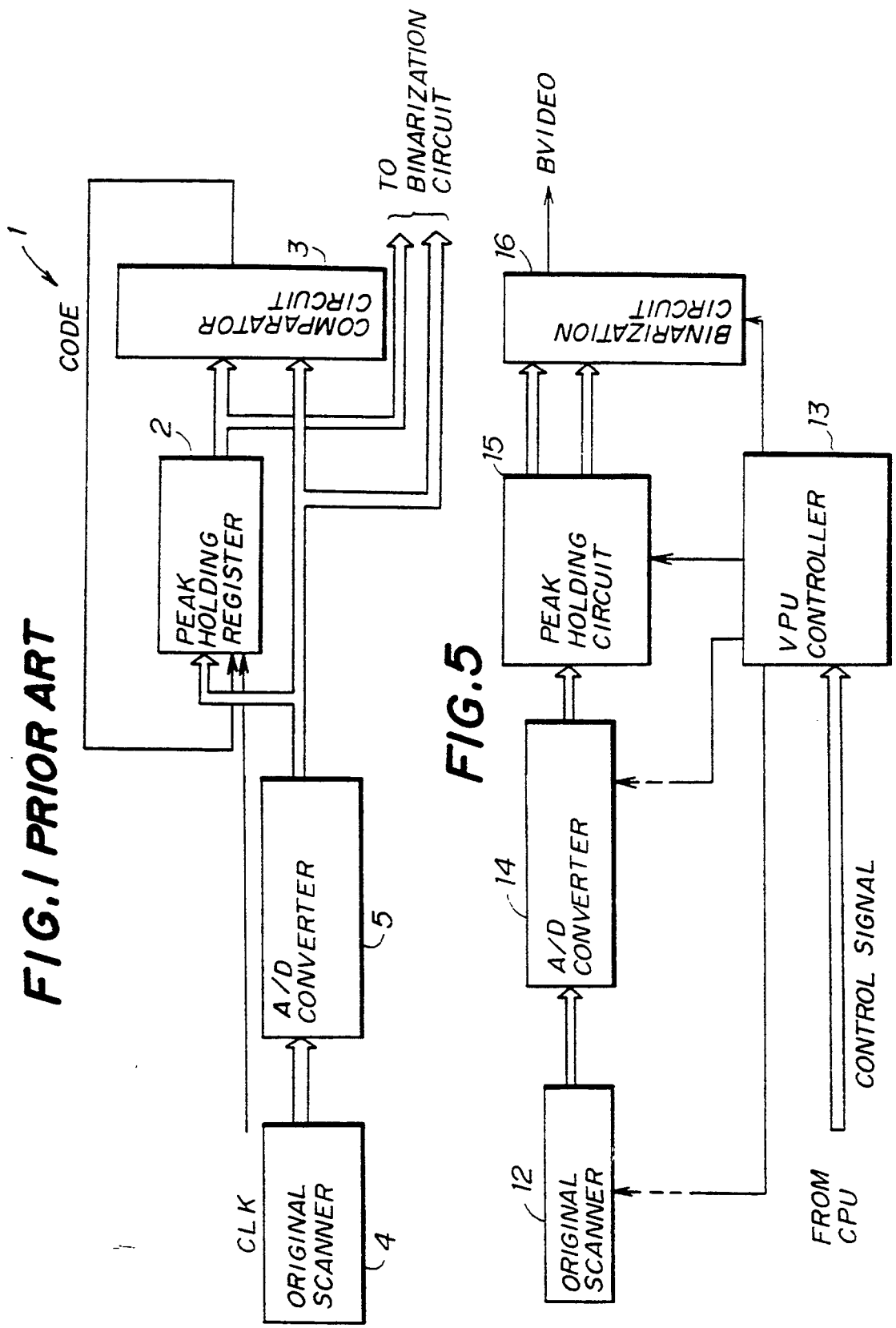
FIG. 1 is a block diagram of a conventional peak holding circuit used in a scanner apparatus.
FIG. 5 is a block diagram showing a first preferred embodiment of the present invention.
Figure 2:
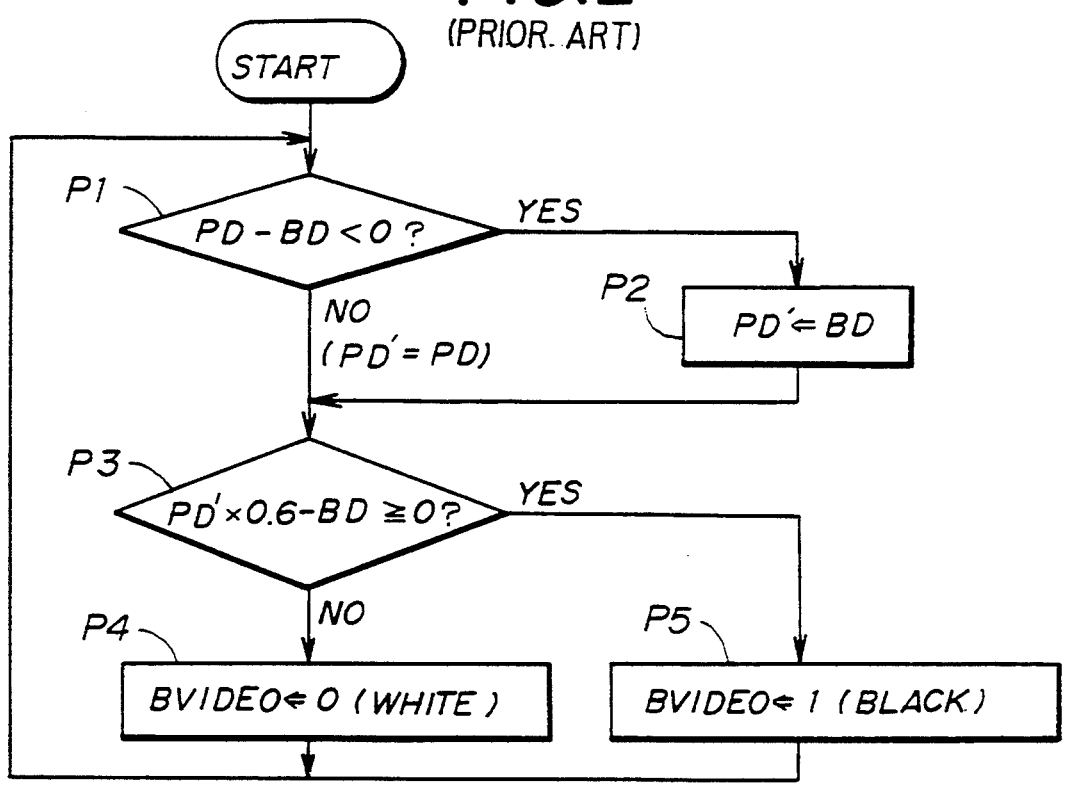
FIG. 2 is a flowchart illustrating the operation of the peak holding circuit shown in FIG. 1 and a binarization procedure which uses data supplied from the peak holding circuit.

A description will now be given of a first embodiment of the present invention with reference to FIG. 5, which illustrates a video processing unit having a peak holding circuit. A video processing unit (VPU) 11 is composed of an original scanner 12, a video processing unit (VPU) controller 13, an A/D converter 14, a peak holding circuit 15 and a binarization circuit 16.

The original scanner 12 is formed of, for example, a line scanner which uses a charge coupled device (CCD). The original scanner 12 reads the original in a line unit, and outputs a corresponding analog video signal. The VPU controller 13 has a built-in central process unit (CPU), and controls the entire operation of the video processing unit 11. The VPU controller 13 is controlled by another CPU (not shown). The A/D converter 14 converts the analog video signal from the original scanner 12 into corresponding input video data (digital video signal).

Figure 6:
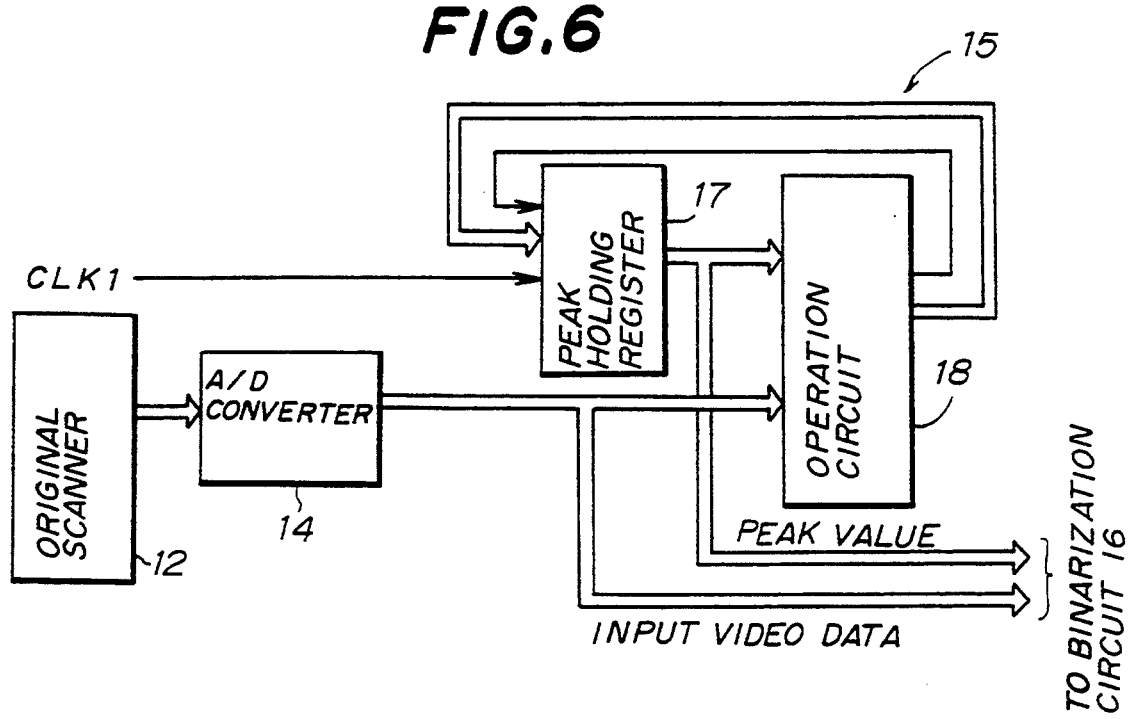
FIG. 6 is a block diagram of a peak holding circuit shown in FIG. 5.

The peak holding circuit 15 has a configuration shown in FIG. 6. The peak holding circuit 15 is composed of a peak holding register 17 and an operation circuit 18. In synchronism with a clock signal CLK1 from an external device, the peak holding register 17 latches a peak value which is output by the operation circuit 18. The operation circuit 18 carries out a predetermined operation (which will described later) on the input video data from the A/D converter 14 and the current peak value latched in the peak holding register 17, and generates a new peak value, which is written into the peak holding register 17. It should be noted the above-mentioned predetermined operation is carried out only when the peak value of the input video data from the A/D converter 14 is greater than the current peak value in the peak holding register 15. The peak value latched in the peak holding register 17 is output to the binarization circuit 16 shown in FIG. 5.

The binarization circuit 16 compares the peak value from the peak holding register 17 with the input video data from the A/D converter 14, and determines whether the input video data is a white signal or a black signal. The result of this determination procedure is output as digital image data BVIDEO.

The operations of the peak holding circuit 15 and the binarization circuit 16 will now be described with reference to FIG. 7. The VPU controller 13 starts to operate in response to a corresponding instruction from the external CPU (not shown). The input video data is input to the operation circuit 18 of the peak holding circuit 15. At step P11 shown in FIG. 7, the operation circuit 18 compares the input video data BD with the current peak value PD, and determines whether or not $PD - BD < 0$. When it is determined that $PD - BD < 0$, a new peak value PD' is calculated in accordance with the following formula (1):

$$PD' = (BD + PD)/2 \qquad (1)$$

On the other hand, when it is determined that $PD - BD \geq 0$, the current peak value PD is set to be the new peak value PD' (PD'=PD). That is, the current peak value PD is not renewed. The new peak value PD' and the input video data from the A/D converter 14 are output to the binarization circuit 16. At step P13, the binarization circuit 16 carries out a binarization procedure which determines whether the input video data is "0" (white) or "1" (black) on the basis of the following formula (2):

$$PD' \times 0.6 - BD \geq 0 \qquad (2)$$

A value of $PD' \times 0.6$ is a slice (threshold) level for the binarization procedure. The coefficient of the formula (2) is not limited to 0.6. When the input video data BD is greater than 60% of the peak value PD' at step P14, the binarization circuit 16 outputs the binarized video data BVIDEO having a value of "0" (white). On the other hand, the input video data BD is equal to or less than 60% of the peak value PD', at step P15, the binarization circuit 16 outputs the binarized video data BVIDEO having a value of "1" (black).

As has described above, according to the first embodiment of the present invention, the peak value written in the peak holding register 17 is renewed by the operation on the current peak value PD and the input video data BD. With this arrangement, it becomes possible to prevent the abnormal bit or bits from being held in the peak holding circuit 11. As a result, it becomes possible to suppress the influence of the abnormal bit (bits) on the reproduced image. Further, it becomes possible to obtain an additional advantage in that a halftone image reproduced by using the peak hold circuit 15 has a smooth expression.

The formula used in the binarization procedure is not limited to the aforementioned formula (1). It is possible to use another formula, such as the following formula (3) and formula (4):

$$PD' = (2BD + PD)/3 \qquad (3)$$

$$PD' = (BD + 2PD)/3.$$

Figure 8:
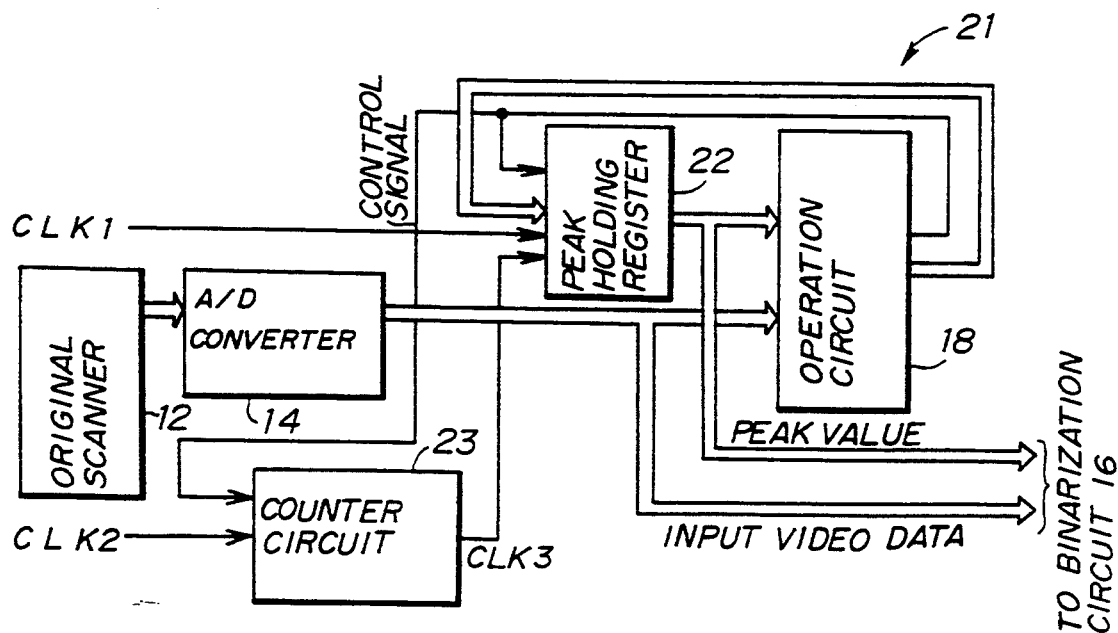
FIG. 8 is a block diagram showing a second preferred embodiment of the present invention.
Figure 9:
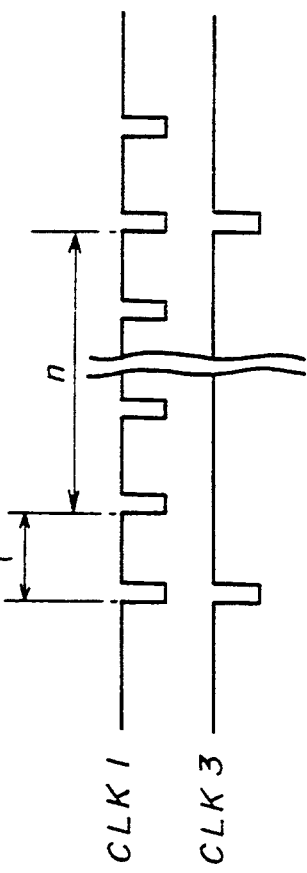
FIG. 9 is a waveform diagram illustrating the relationship between clock signals CLK1 and CLK3.

A description will now be given of a second preferred embodiment of the present invention with reference to FIG. 8, in which those parts which are the same as those shown in FIGS. 5 and 6 are given the same reference numerals. The configuration shown in FIG. 8 has a peak holding circuit 21, which is made up of a peak holding register 22, a counter circuit 23 and the aforementioned operation circuit 18. The peak holding register 22 has a down counting function. In synchronism with the clock signal CLK1, the peak value calculated and output by the operation circuit 18 is written into the peak holding register 22. The counter circuit 23 generates a clock pulse CLK3 when it counts a predetermined number of clock pulses CLK2 supplied from an external device. Each clock pulse CLK2 is generated each time the processing of data related to one line is completed. The peak holding register 22 counts down a predetermined value from the peak value latched therein in synchronism with the clock signal CLK3. For example, the peak holding register 22 decrements 1 from its count value in synchronism with the clock signal CLK3. The clock signal CLK3 is used for having the peak holding register 22 count down the predetermined value when the peak value has not yet renewed after data related to a predetermined number of successive lines are processed. The relationship between the clock signals CLK1 and CLK3 is shown in FIG. 9.

Figure 7:
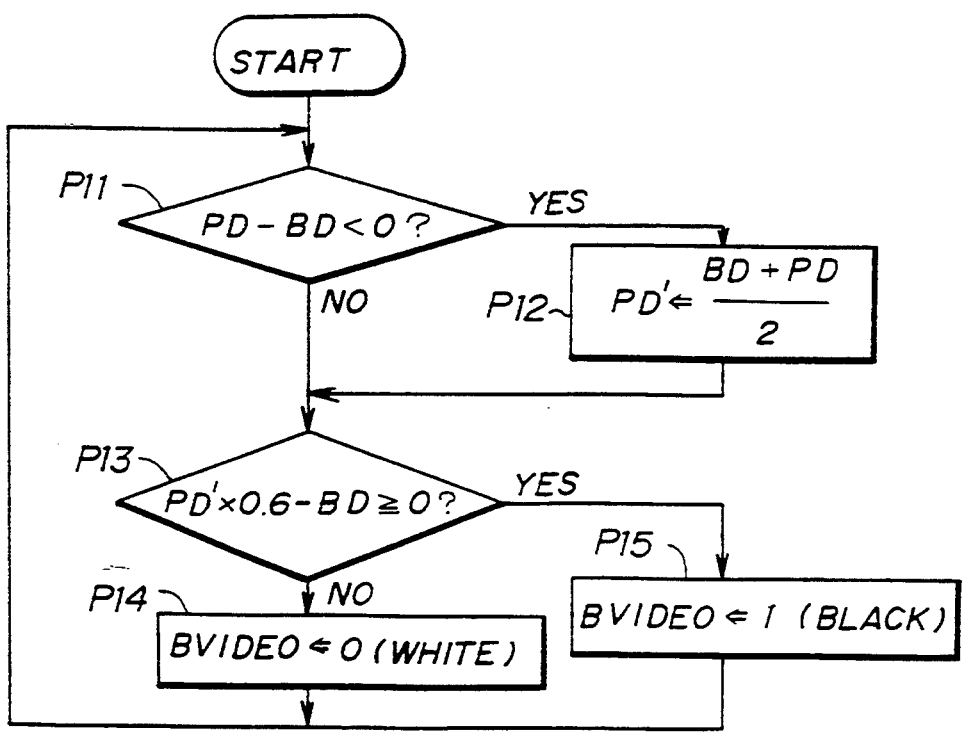
FIG. 7 is a flowchart showing the operation of the first preferred embodiment of the present invention.

The procedure shown in FIG. 7 holds true for the operations of the operation circuit 18 and the peak holding registers 22 as well as the binarization procedure of the binarization circuit 16. According to the second embodiment of the present invention, when an abnormal bit(s) is latched in the peak holding register 22, an additional procedure is carried out. The additional procedure is to determine whether or not the peak value caused by the abnormal bit is maintained in the peak holding circuit 22 for a predetermined time defined by the clock signal CLK3 and to count down a predetermined value (equal to 1, for example) from the latched peak level each time the predetermined time has elapsed (that is, the clock signal CLK3 is generated).

Figure 10:
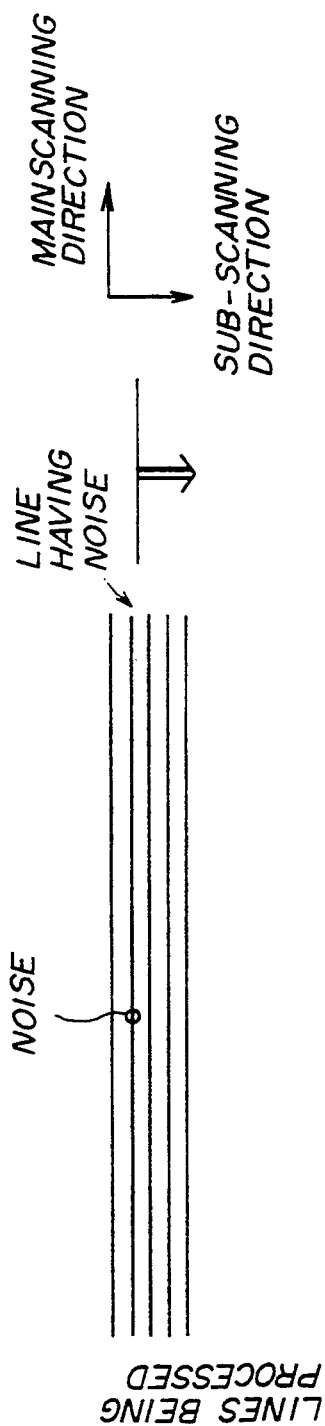
FIG. 10 is a diagram illustrating the operation of the second embodiment of the present invention.

Referring to FIG. 10, when there is a noise in a line and the peak value caused by the noise is latched in the peak holding circuit 22, binarized video data BVIDEO related to consecutive lines subsequent to the line having the noise in a sub-scanning direction perpendicular to a main scanning direction are affected by the peak value caused by the noise. In order to suppress the influence of the peak value caused by the noise, when the same peak value is maintained in the peak holding circuit 22 during a predetermined period (n) defined by the clock signal CLK3, the peak holding circuit 22 counts down the predetermined value from the peak value held therein. Assuming that the counter value is equal to "1" the peak value obtained at the n-th line from the line having the noise is equal to (PD'−1), and the peak value obtained at the 2n-th line therefrom is equal to (PD'−2). As the above procedure proceeds, the influence of the noise decreases. If the peak value is renewed during the predetermined period, the operation circuit 18 outputs a control signal to the peak holding register 22 and the counter circuit 23, so that the counter circuits 23 starts to count the predetermined number of clock pulses CLK2.

The present invention is not limited to the specifically disclosed embodiments, and variations and modifications may be made without departing from the scope of the present invention.

What is claimed is:

1. A video processing unit, comprising:
    scanner means for optically scanning an original and for generating an analog video signal from the original;
    converting means for converting said analog video signal into a digital video signal;
    a peak holding circuit, comprising peak holding register means for holding a current peak value and operation means for comparing said current peak value with said digital video signal and, when said digital video signal has a value that is greater than said current peak value, for performing a predetermined averaging operation on said current peak value and said digital video signal to produce a new peak value that is between said current peak value and said digital video signal, and for writing said new peak value into said peak holding register means; and
    binarization means generating a binarized digital video signal from said new peak value in said peak holding register means.

2. A video processing unit as claimed in claim 1, wherein said binarization means comprises:
    judgment means for judging the following inequality is satisfied:

$$PD' \times A - BD > 0$$

wherein PD' is the current peak value, BD is the digital video signal, and A is a predetermined constant; and
    generating means for generating said binarized video signal so that said binarized video signal is equal to "1" when said inequality is satisfied and equal to "0" when said inequality is not satisfied.

3. A circuit as claimed in claim 1, wherein said operation means comprises means for calculating the following formula:

$$PD' = (BD + PD)/2$$

where BD is the digital video signal, PD is the current peak value, and PD' is a renewed peak value which is written into said peak holding register means as said current peak value.

4. A circuit as claimed in claim 1, wherein said operation means comprises means for calculating the following formula:

$$PD' = (2BD + PD)/3$$

where BD is the digital video signal, PD is the current peak value, and PD' is a renewed peak value which is written into said peak holding register means as said current peak value.

5. A peak holding circuit as claimed in claim 1, wherein said operation means comprises means for calculating the following formula:

$$PD' = (BD + 2PD)/3$$

where BD is the digital video signal, PD is the current peak value, and PD' is a renewed peak value which is written into said peak holding register means as said current peak value.

6. A circuit as claimed in claim 1, further comprising:
    determining means whether or not said current peak value is renewed before a predetermined period has elapsed; and
    decreasing means for decreasing said current peak value held in said peak holding register means by a predetermined value each time said determining means determines that current peak value is renewed during said predetermined period.

7. A circuit as claimed in claim 6, wherein said determining means comprises counter means for counting said predetermined period and for generating a clock signal when said predetermined period has been counted.

8. A video processing unit, comprising:
    scanner means for optically scanning an original and for generating an analog video signal from the original;
    converting means for converting said analog video signal into a digital video signal;

a peak holding circuit, comprising peak holding register means for holding a current peak value, operation means for comparing said current peak value with said digital video signal and for performing a predetermined averaging operation on said current peak value and said digital video signal when said digital video signal has a value that is greater than said current peak value thereby generating a new peak value which is between said current peak value and said digital video signal, and for writing said new peak value into said peak holding register means before comparing another input signal value with the value stored in the peak holding register means; and binarization means generating a binarized digital video signal from said new peak value in said peak holding register means.

* * * * *